(12) United States Patent
Porter et al.

(10) Patent No.: US 7,451,418 B2
(45) Date of Patent: Nov. 11, 2008

(54) ALPHA-PARTICLE-TOLERANT SEMICONDUCTOR DIE SYSTEMS, DEVICES, COMPONENTS AND METHODS FOR OPTIMIZING CLOCK RATES AND MINIMIZING DIE SIZE

(75) Inventors: Howard L. Porter, Loveland, CO (US); Richard S. Rodgers, Fort Collins, CO (US); Troy Frerichs, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 239 days.

(21) Appl. No.: 11/523,247

(22) Filed: Sep. 19, 2006

(65) Prior Publication Data

US 2007/0032065 A1 Feb. 8, 2007

Related U.S. Application Data

(63) Continuation-in-part of application No. 11/189,227, filed on Jul. 26, 2005, now Pat. No. 7,386,824.

(51) Int. Cl.
*G06F 17/50* (2006.01)

(52) U.S. Cl. ............... 716/6; 716/1; 716/12; 716/19

(58) Field of Classification Search ............... 716/1, 716/6, 12, 19
See application file for complete search history.

(56) References Cited

U.S. PATENT DOCUMENTS

| | | | |
|---|---|---|---|
| 4,679,171 A | 7/1987 | Logwood et al. | |
| 4,887,236 A | 12/1989 | Schloemann | |
| 5,594,262 A | 1/1997 | Lee et al. | |
| 5,886,375 A | 3/1999 | Sun | |
| 5,999,440 A | 12/1999 | Crafts | |
| 6,043,429 A | 3/2000 | Blish, II et al. | |
| 6,329,712 B1 | 12/2001 | Akram et al. | |
| 6,436,737 B1 | 8/2002 | Malladi | |
| 6,483,134 B1 | 11/2002 | Weatherford et al. | |
| 6,504,256 B2 | 1/2003 | Shah et al. | |
| 6,507,511 B1 | 1/2003 | Barth, Jr. et al. | |
| 6,531,759 B2 | 3/2003 | Wachnik et al. | |

(Continued)

OTHER PUBLICATIONS

Frye, "Design Issues for Flip-Chip IC's in Multilayer Packages IEEE", (1997).

*Primary Examiner*—Thuan Do (57) ABSTRACT

Systems and methods are disclosed herein for determining the placement of storage and non-storage cells or components, representing a semiconductor component in a design stage, on an integrated circuit die. In one embodiment, regions of a semiconductor die are analyzed with respect to the susceptibility of a region to be exposed to radiation and the distance between a storage component and a local clock buffer. The radiation, for instance, may be alpha particle radiation emitted from lead (Pb) isotopes in solder bumps formed on the integrated circuit die. The distance, spatial positioning and/or physical proximity of a selected local clock buffer and a storage component are preferably selected so that the skew between the storage component and the local clock buffer is about 30 picoseconds or less. Other maximum skews may be employed, however, such as about 100 picoseconds or less, about 90 picoseconds or less, about 80 picoseconds or less, about 70 picoseconds or less, about 60 picoseconds or less, about 50 picoseconds or less, about 40 picoseconds or less, about 20 picoseconds or less, about 10 picoseconds or less and about 5 picoseconds or less.

35 Claims, 5 Drawing Sheets

U.S. PATENT DOCUMENTS

| | | |
|---|---|---|
| 6,538,334 B2 | 3/2003 | Akram et al. |
| 6,548,392 B2 | 4/2003 | Akram et al. |
| 6,693,820 B2 | 2/2004 | Nii et al. |
| 6,724,676 B1 | 4/2004 | Schneider et al. |
| 6,744,661 B1 * | 6/2004 | Shubat .................. 365/156 |
| 6,785,847 B1 | 8/2004 | Jordan et al. |
| 6,891,743 B2 | 5/2005 | Ohbayashi et al. |
| 7,081,635 B2 | 7/2006 | Baumann |
| 2004/0063288 A1 | 4/2004 | Kenney et al. |

* cited by examiner

ALPHA-PARTICLE-TOLERANT SEMICONDUCTOR DIE SYSTEMS, DEVICES, COMPONENTS AND METHODS FOR OPTIMIZING CLOCK RATES AND MINIMIZING DIE SIZE

RELATED APPLICATION

This application is a continuation-in-part of U.S. patent application Ser. No. 11/189,227 to Howard L. Porter et al. filed Jul. 26, 2005 now U.S. Pat. No. 7,386,824 and entitled "Determining the Placement of Semiconductor Components on an Integrated Circuit," the disclosure of which is hereby incorporated herein in its entirety.

FIELD OF THE INVENTION

The present invention relates to the field of semiconductor die design, fabrication and operation.

BACKGROUND

In the field of integrated circuits, miniaturization has been a goal for circuit designers in order to increase processing speed and reduce energy consumption. As components continue to be reduced in size, the efficient utilization of the available silicon space on the semiconductor dies is an important consideration that cannot be avoided.

Another consideration in circuit design is the reliability of the interconnections between the integrated circuit die and the package that houses the die. Two interconnection techniques, in particular, stand out as the preferred techniques for such connections. A first technique is "wire-bonding" in which relatively long wires are used to electrically couple pads near an outer edge of a top surface of the die to pads on a top surface of a substrate of the package. A second technique is a "flip-chip" technique, which uses an array of short conductive leads, e.g. solder bumps, connecting the die directly to the substrate. The term "flip-chip" refers to the way in which the die is attached to the package. The die is flipped, with respect to the wire-bonding technique, such that the top of the die is attached to the substrate and the backside of the die faces away from the substrate.

Flip-chip packages offer some significant advantages over wire-bond packages. For instance, power can be supplied at the center of the die through solder bumps instead of just at the edges. This reduces the voltage drop at the center of the die without having to use long metal conductors to route the power to the center of the die. Other benefits of flip-chip packages are their relatively shorter interconnections, high frequency response, low inductance, and better signal-to-noise ratio.

Preferably, solder is the material of choice for establishing interconnections between the flip-chip die and the substrate. Solder provides desirable conduction and processing characteristics and reliable physical strength. To mount the die on the substrate using a conventional method, solder bumps are deposited on solder wettable conductive pads on the die and an identical pattern of solder wettable pads are deposited on the substrate. Then the solder bumps on the die are aligned with the solder pads on the substrate, and the die is placed on top of the substrate, typically with an "underfill" therebetween. Then the solder is reflowed (melted) to create a good electrical and mechanical connection.

The solder that is typically used for these solder bumps consists of about 95% to about 97% lead (Pb) and about 3% to about 5% tin (Sn). Most lead (Pb) used in solder contains a $Pb^{210}$ isotope that naturally emits alpha particles with an energy of about 5.5 million electron volts (5.5 MeV). Solder bumps may also contain other alpha particle emitters, including, but not limited to, one or more of $U^{235}$, $U^{238}$, and $Th^{232}$ isotopes. In addition, other elements of the flip-chip package, such as the underfill, may also emit alpha particles. However, the majority of alpha particle emission is attributable to the solder bumps.

Alpha particles are randomly emitted from the solder bumps, or other sources, and can create electron-hole pairs in the silicon. An electron-hole pair is created when an electron is displaced from its atom and a positively charged "hole" is left in its place. Each electron-hole pair in silicon requires about 3.3 electron volts (3.3 eV) for its creation. An alpha particle having an initial energy, for example, of 5.5 MeV can create thousands of electron-hole pairs, but loses energy during electron-hole creation. If the accumulation of positive or negative charges from the electron-hole pairs reaches a certain value, the accumulated charge can change the state of a radiation-sensitive memory cell from a 0 to a 1 or vice versa. For example, these radiation-sensitive memory cells may include bit storage devices, such as storage nodes, registers, latches, etc. The bit errors in these memory cells are sometimes referred to as "soft errors", since the semiconductor component eventually returns to its original configuration and is not permanently affected. Nevertheless, soft errors degrade the integrity of the memory cells and are unacceptable. Therefore, the location of the solder bumps with respect to radiation-sensitive components is a design consideration that should normally be taken into account.

In order to reduce soft errors in the memory cells, a few solutions have been proposed in the prior art. One solution involves placing a "blocking" region in a layer adjacent to the solder bumps of the flip-chip die for blocking alpha particle radiation. The blockage region typically extends beyond the area directly under the solder bump, such that it will be large enough to block alpha particles emitted from a solder bump to such a degree that the energy of any alpha particles will predictably have the same or less chance of causing an error than the underfill. One problem with this solution, however, is that the blocking region prevents any type of semiconductor component from being placed in these locations, thereby reducing the area on the silicon that can be used for component placement. Also, placement engines in the prior art are designed to simply restrict the placement of any component at these blocked regions. This results in unusable, wasted space on the silicon.

Another prior art method for reducing soft errors is by designing the memory cells as "alpha-hardened" cells. Alpha-hardened cells contain circuitry that is better able to withstand alpha particle strikes. In this respect, a much greater energy from the alpha particles will be required to change the state of these alpha-hardened components. However, one problem with this solution is that the alpha-hardened memory elements are typically three to four times larger than normal memory elements. Also, since a circuit designer will usually not know beforehand which memory elements might be placed under the solder bumps, the designer will usually convert all memory elements to alpha-hardened elements to be safe. Since these components are larger, they will naturally take up more space on the silicon, thereby leaving less space on the silicon for additional components.

Another prior art solution to the soft error problem is the use of "low-alpha emitting solder". This type of solder can be made by removing all alpha particle emitting isotopes, such as $Pb^{210}$, from the lead. However, completely separating the radioactive isotopes from the lead in the solder bumps is both difficult and expensive. Another solution involves providing an alpha particle absorbing material. However, this too is an expensive solution.

Therefore, there is a need in the art for a better solution for reducing soft errors in memory cells, particularly a solution that overcomes the deficiencies of the prior art. Systems and methods are needed for better utilizing the space on the silicon die while reducing the number of soft errors in the memory elements and keeping material costs low. In this way, the reliability of the semiconductor device can be enhanced without extra costs. What is also needed is a semiconductor die having relatively short distances between local clock buffers and storage cells or components to permit fast clock rates therebetween.

Various patents containing subject matter relating directly or indirectly to the field of the present invention include, but are not limited to, the following:

U.S. Pat. No. 4,887,236 to Schloemann for "Non-volatile, radiation-hard, random-access memory," Dec. 12, 1989.

U.S. Pat. No. 5,594,262 to Lee et al. for "Elevated temperature gallium arsenide field effect transistor with aluminum arsenide to aluminum gallium arsenide mole fractioned buffer layer," Jan. 14, 1997.

U.S. Pat. No. 5,886,375 to Sun for "SRAM having improved soft-error immunity," Mar. 23, 1999.

U.S. Pat. No. 5,999,440 to Crafts for "Embedded DRAM with noise-protecting substrate isolation well," Dec. 7, 1999.

U.S. Pat. No. 6,043,429 to Blish, II et al. for "Method of making flip chip packages," Mar. 28, 2000.

U.S. Pat. No. 6,329,712 to Akram et al. for "High density flip chip memory arrays," Dec. 11, 2001.

U.S. Pat. No. 6,436,737 to Malladi for "Method for reducing soft error rates in semiconductor devices," Aug. 20, 2002.

U.S. Pat. No. 6,483,134 to Weatherford et al. for "Integrated circuits with immunity to single event effects," Nov. 19, 2002.

U.S. Pat. No. 6,504,256 to Shah et al. for "In-situ radiation protection of integrated circuits," Jan. 7, 2003.

U.S. Pat. No. 6,507,511 to Barth, Jr. et al. for "Secure and dense SRAM cells in EDRAM technology," Jan. 14, 2003.

U.S. Pat. No. 6,531,759 to Wachnik et al. for "Alpha particle shield for integrated circuit," Mar. 11, 2003.

U.S. Pat. No. 6,538,334 to Akram et al. for "High density flip chip memory arrays," Mar. 25, 2003.

U.S. Pat. No. 6,548,392 to Akram et al. for "Methods of a high density flip chip memory arrays," Apr. 15, 2003.

U.S. Pat. No. 6,693,820 to Nii et al. for "Soft error resistant semiconductor memory device," Feb. 17, 2004.

U.S. Pat. No. 6,724,676 to Schneider et al. for "Soft error improvement for latches," Apr. 20, 2004.

U.S. Pat. No. 6,891,743 to Ohbayashi et al. for "Semiconductor memory device having a capacitive plate to reduce soft errors," May 10, 2005.

U.S. Pat. No. 7,081,635 to Baumann for "High activity, spatially distributed radiation source for accurately simulating semiconductor device radiation environments," Jul. 25, 2006.

U.S. Patent Application Publication No. 20040063288 to Kenney et al. for "System and method for reducing soft error rate utilizing customized epitaxial layers," Apr. 1, 2004.

The dates of the foregoing publications may correspond to any one of priority dates, filing dates, publication dates and issue dates. Listing of the above patents and patent applications in this background section is not, and shall not be construed as, an admission by the applicants or their counsel that one or more publications from the above list constitutes prior art in respect of the applicant's various inventions. All printed publications and patents referenced herein are hereby incorporated by referenced herein, each in its respective entirety.

Upon having read and understood the Summary, Detailed Descriptions and Claims set forth below, those skilled in the art will appreciate that at least some of the systems, devices, components and methods disclosed in the printed publications listed herein may be modified advantageously in accordance with the teachings of the various embodiments of the present invention.

SUMMARY

Systems and methods are disclosed herein for determining the placement of storage and non-storage cells or components, representing a semiconductor component in a design stage, on an integrated circuit die. In one embodiment, regions of a semiconductor die are analyzed with respect to the susceptibility of a region to be exposed to radiation and the distance between a storage component and a local clock buffer. The radiation, for instance, may be alpha particle radiation emitted from lead (Pb) isotopes in solder bumps formed on the integrated circuit die. The distance, spatial positioning and/or physical proximity of a selected local clock buffer and a storage component are is preferably selected so that the skew between the storage component and the local clock buffer is about 100 picoseconds, about 90 picoseconds, about 80 picoseconds, about 70 picoseconds, about 60 picoseconds, about 50 picoseconds, about 40 picoseconds, about 30 picoseconds, about 20 picoseconds, about 10 picoseconds or about 5 picoseconds or less. In a preferred embodiment of the present invention, such distance, spatial position and/or physical proximity are selected so that the skew between the storage component and the local clock buffer is about 30 picoseconds, about 20 picoseconds, about 10 picoseconds or about 5 picoseconds or less.

In one embodiment of the present invention, there is provided a semiconductor die comprising a first region comprising at least one solder bump and at least one non-storage element, the first region having high alpha particle radiation; a second region comprising at least one local clock buffer operably connected to and spatially positioned in respect of at least one storage element such that the maximum skew therebetween does not exceed about 100 picoseconds, the second region having low alpha particle radiation; and where the first region contains no storage elements. The distance, spatial positioning and/or physical proximity are preferably selected so that the skew between the storage component and the local clock buffer is about 100 picoseconds, about 90 picoseconds, about 80 picoseconds, about 70 picoseconds, about 60 picoseconds, about 50 picoseconds, about 40 picoseconds, about 30 picoseconds, about 20 picoseconds, about 10 picoseconds or about 5 picoseconds or less. In a preferred embodiment of the present invention, such spatial positioning is selected so that the skew between the storage component and the local clock buffer is about 30 picoseconds, about 20 picoseconds, about 10 picoseconds or about 5 picoseconds or less.

In another embodiment of the present invention, there is provided a method of designing a semiconductor die comprising defining first and second regions in the die, placing in the first region at least one solder bump and at least one non-storage element, placing in the second region at least one local clock buffer operably connected to and spatially positioned in respect of at least one storage element such that the maximum skew therebetween does not exceed about 100 picoseconds, and placing no storage elements in the first region. The distance, spatial positioning and/or physical proximity are preferably selected so that the skew between the storage component and the local clock buffer is about 100 picoseconds, about 90 picoseconds, about 80 picoseconds, about 70 picoseconds, about 60 picoseconds, about 50 picoseconds, about 40 picoseconds, about 30 picoseconds, about 20 picoseconds, about 10 picoseconds or about 5 picoseconds or less. In a preferred embodiment of the present invention, such distance, spatial positioning and/or physical proximity are selected so that the skew between the storage component and the local clock buffer is about 30 picoseconds, about 20 picoseconds, about 10 picoseconds or about 5 picoseconds or less.

In yet another embodiment of the present invention, there is provided a method of making a semiconductor die comprising providing first and second regions for the die, fabricating in the first region at least one solder bump and at least one non-storage element, fabricating in the second region at least one local clock buffer operably connected to and spatially positioned in respect of at least one storage element such that the maximum skew therebetween does not exceed about 100 picoseconds, and fabricating no storage elements in the first region. The distance, spatial positioning and/or physical proximity are preferably selected so that the skew between the storage component and the local clock buffer is about 100 picoseconds, about 90 picoseconds, about 80 picoseconds, about 70 picoseconds, about 60 picoseconds, about 50 picoseconds, about 40 picoseconds, about 30 picoseconds, about 20 picoseconds, about 10 picoseconds or about 5 picoseconds or less. In a preferred embodiment of the present invention, such distance, spatial positioning and/or physical proximity are selected so that the skew between the storage component and the local clock buffer is about 30 picoseconds, about 20 picoseconds, about 10 picoseconds or about 5 picoseconds or less.

In still another embodiment of the present invention, there is provided a computer system comprising memory for storing a placement engine, and a processor in communication with the memory, the processor being configured to execute the placement engine stored in the memory. The placement engine comprises logic configured to determine the location of solder bumps on an integrated circuit die; logic configured to determine a first set of regions including the areas on the integrated circuit die in proximity to the solder bumps; logic configured to determine a second set of regions including the areas on the integrated circuit die outside the first set of regions; logic configured to identify whether a standard cell is a storage element or a non-storage element; logic configured to place the standard cell in one of the second set of regions and in proximity to a local clock buffer such that skew therebetween is about 100 picoseconds or less if the standard cell is identified to be a storage element; and logic configured to place the standard cell anywhere on the integrated circuit die if the standard cell is identified to be a non-storage component. The spatial positioning, distance and/or proximity are preferably selected so that the skew between the storage component and the local clock buffer is about 100 picoseconds, about 90 picoseconds, about 80 picoseconds, about 70 picoseconds, about 60 picoseconds, about 50 picoseconds, about 40 picoseconds, about 30 picoseconds, about 20 picoseconds, about 10 picoseconds or about 5 picoseconds or less. In a preferred embodiment of the present invention, such spatial positioning, distance and/or proximity are selected so that the skew between the storage component and the local clock buffer is about 30 picoseconds, about 20 picoseconds, about 10 picoseconds or about 5 picoseconds or less.

In addition to the foregoing embodiments of the present invention, review of the detailed description and accompanying drawings will show that other embodiments of the present invention exist. Accordingly, many combinations, permutations, variations and modifications of the foregoing embodiments of the present invention not set forth explicitly herein will nevertheless fall within the scope of the present invention.

BRIEF DESCRIPTION OF THE DRAWINGS

Different aspects of the various embodiments of the present invention will become apparent from the following specification, drawings and claims in which:

The drawings are not necessarily to scale. Like numbers refer to like parts or steps throughout the drawings.

DETAILED DESCRIPTIONS

Set forth below are detailed descriptions of some preferred embodiments of the systems, devices and methods of the present invention.

In flip-chip technology, circuit designers take into account the fact that solder bumps emit alpha particles to nearby semiconductor components. According to the teachings of the present disclosure, a circuit designer can create a circuit that reduces alpha particle radiation effects, such as soft errors in memory cells of a flip-chip die, and that increases clock rates between local clock buffers and storage components, while utilizing the space on the silicon to the fullest extent possible and keeping the material costs low. The present invention allows non-storage node standard cells or components to be placed under or otherwise in proximity to alpha-generating solder bumps 14 while restricting the placement of storage cells or components. This permits the use of smaller yet faster storage devices throughout a die of given design and allows logic cells to occupy previously wasted silicon area. Storage components are further restricted to be placed in close proximity to local clock buffers 26. This prevents storage cells from being placed in regions without a needed clock buffer. The placement engine need not know in advance the location of storage components.

In the prior art, a blocking region may be used which restricts the use of a large percentage of the silicon space in proximity to the solder bumps. Alternatively, the prior art also teaches the use of alpha-hardened devices that are larger in size and take up more area on the silicon. Either way, silicon space is wasted. Also, more expensive materials have been used in the prior art for reducing or absorbing alpha particle emissions. However, none of these techniques utilizes the silicon space in an efficient manner using cost-effective materials.

In the present application, a design strategy is used for better utilizing the space on the silicon die. By using a placement algorithm to place "standard cells", which represent the semiconductor components in the design stage, in a manner as described herein, more space can be utilized. This placement technique puts radiation-sensitive components in locations where they are less likely to be affected by alpha particles, and also optimizes clock rates. Components that are insensitive to alpha particle radiation can be placed anywhere on the die. A placement engine of the present disclosure determines placement based on a component's sensitivity to alpha particles and spatial proximity to a local clock buffer.

The placement strategy of the present disclosure does not require any additional material costs and is therefore more cost effective than many prior art solutions. Of course, after designing the placement of the standard cells on the die during this design stage, the die can be fabricated during a fabrication stage with the semiconductor components positioned on the die according to the placement strategy for the standard cells.

Figure 1:
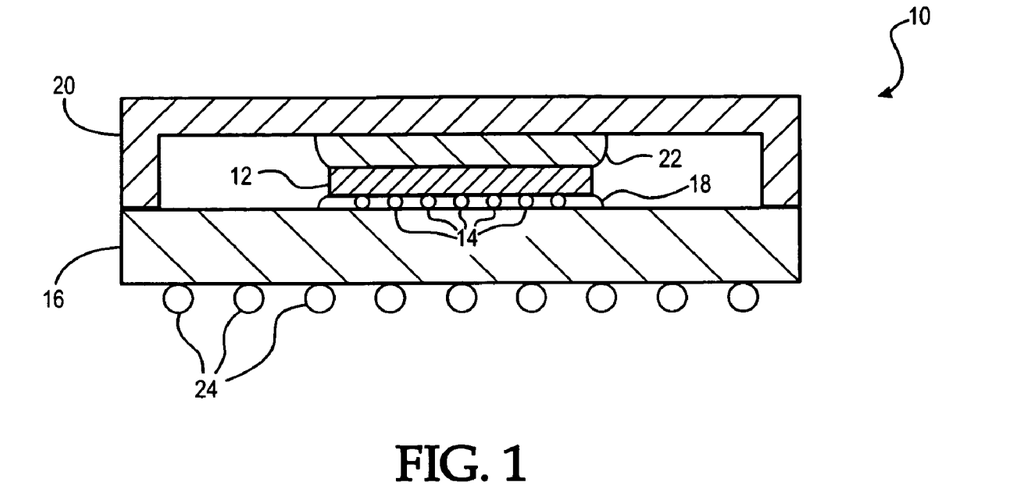
FIG. 1 is a sectional view of an embodiment of a flip-chip die attached within a package.

FIG. 1 is a sectional view of an embodiment of an integrated circuit (IC) package 10. In this embodiment, the IC package 10 includes a flip-chip die 12 having solder bumps 14 formed on a surface of the flip-chip die 12. The flip-chip die 12 may have any number of solder bumps 14. The solder bumps 14 electrically and physically connect pads or terminals on the surface of the flip-chip die 12 with pads or terminals on a surface of a substrate 16. To enhance the strength of the physical connection between the flip-chip die 12 and the substrate 16, an underfill material 18 may also be used. The IC package 10 may also include a lid 20 formed over the flip-chip die 12 to protect it from the environment. The IC package 10 may also include a thermal compound 22 applied between the flip-chip die 12 and the lid 20. The thermal compound 22 may alternatively be configured as a heat sink for dissipating heat from the flip-chip die 12.

The IC package 10, as shown in FIG. 1, is illustrated as a ball grid array (BGA) package. In this embodiment, the BGA package includes solder balls 24 for connection to a printed circuit board or other suitable circuit structure. Alternatively, the IC package 10 may be configured as a pin grid array (PGA) in which pins, in place of the solder balls 24, are used for connection to other circuitry. It should be noted that the IC package 10 may have any number or arrangement of solder balls 24 or pins and can be arranged, in addition to BGA or PGA packages, in any suitable configuration for protecting the flip-chip die 12 and electrically coupling the die 12 to external circuitry.

In the present invention, it is contemplated that semiconductor components formed on die 12 are not all the same in respect of tolerance to alpha radiation.

Some components are sensitive to alpha particles and cannot be placed in proximity to alpha particle sources. These components should be placed far enough away from the locations of alpha particle source, such as alpha particle emitting solder bumps 14, such that the effects of the alpha particles upon the components are minimal.

Components sensitive to alpha particle radiation include any structure that might be classified as a "storage element", such as latches, memory cells, memories, RAM, DRAM, SRAM, CAM, registers, registers and flops, register arrays, register files, register arrays, synchronous registers, registers with reset, registers with clear, registers with pre-set, asynchronous registers, scannable registers, non-scannable registers, and the like.

Also, the methods described herein include identifying components that are tolerant of alpha particle radiation or that are "radiation-insensitive". Since the operation of such components is not severely affected by alpha particles, they may be placed anywhere on the silicon, even in close proximity to or under solder bumps 14. These radiation-insensitive components include so-called "combinational cells," "combination cells" and/or "combinational logic cells," which include inverters, logic gates, buffers, MUX gates, AND gates, NAND gates, OR gates, NOR gates, XOR gates, circuits containing combinations of the foregoing, and similar devices and logic devices. Even when such components are struck by an alpha particle, the effect is temporary and the operation of the component is generally not affected.

In one embodiment of the present invention, an improved placement engine is employed to locate or place components based on their sensitivity to alpha particles. The placement engine does not include a strategy of blocking all components from certain regions as is done in the prior art, but only blocks radiation-sensitive components from certain regions. Additionally, storage elements are placed in relatively close spatial proximity to local clock buffers so as to maintain skews between local clock buffers and storage elements at or below a maximum of 30 picoseconds, thereby preserving high clock rates in respect of such components. Also, the present placement engine places regularly-sized memory elements in the circuit instead of bulky alpha-hardened components. Note, however, that other maximum skews may be employed in various embodiments of the present invention, including, but not limited to, skews between a storage component and a local clock buffer of about 100 picoseconds, about 90 picoseconds, about 80 picoseconds, about 70 picoseconds, about 60 picoseconds, about 50 picoseconds, about 40 picoseconds, about 30 picoseconds, about 20 picoseconds, about 10 picoseconds and about 5 picoseconds or less. In preferred embodiments of the present invention, such skews are about 30 picoseconds, about 20 picoseconds, about 10 picoseconds or about 5 picoseconds or less.

Figure 2:
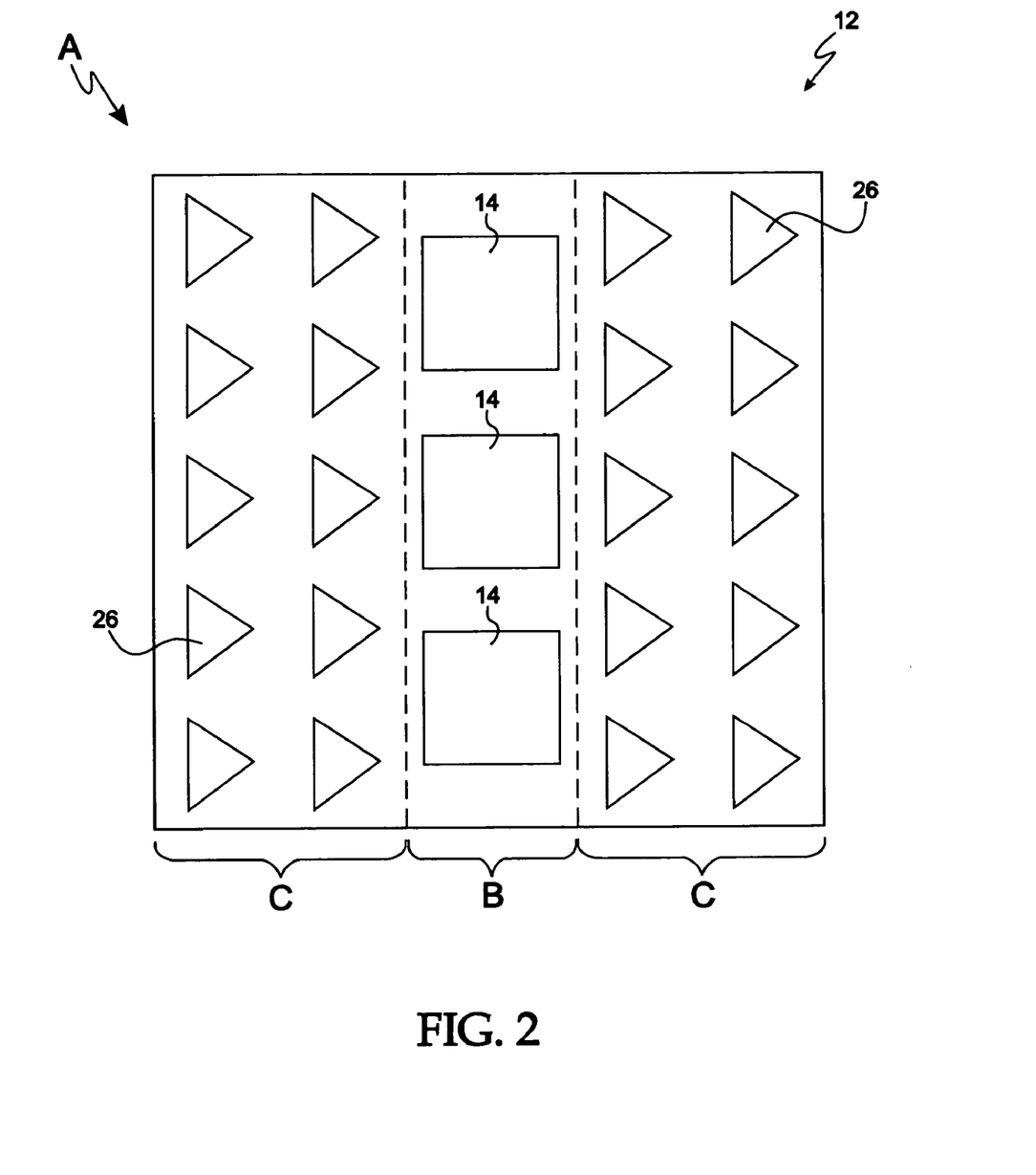
FIG. 2 is a view of an embodiment of an array of solder bumps formed on a flip-chip die.

FIG. 2 is a view of the "top" side of the flip-chip die 12 shown in FIG. 1. Typically, this side is referred to as the top side, although with flip-chip technology, the chip is "flipped" with respect to the wire-bond configuration and it is actually oriented as the bottom surface. However, the terms "top" and "bottom" are used herein to define the chip as it is shown in the drawings, but it should be noted that these orientations are used merely for illustration purposes only and can also be changed depending on how a package might be oriented in space.

FIG. 2 includes a number of solder bumps 14 arranged in an array. Although the array is shown as a 1×3 array, it is to be understood that any number or arrangement of solder bumps 14 may be formed in region B on the top side of flip-chip die 12. As shown in FIG. 2, flip-chip die 12 is separated into first and second regions B and C, respectively. Third region A includes both of regions B and C. Region B contains solder bumps 14, while Region C contains local clock buffers 26. According to one embodiment of the present invention, Region B contains no storage components but may contain non-storage components such as combination cells or combinational logic cells. Region C may contain both non-storage components and storage components (such as local clock buffers 26).

Figure 3:
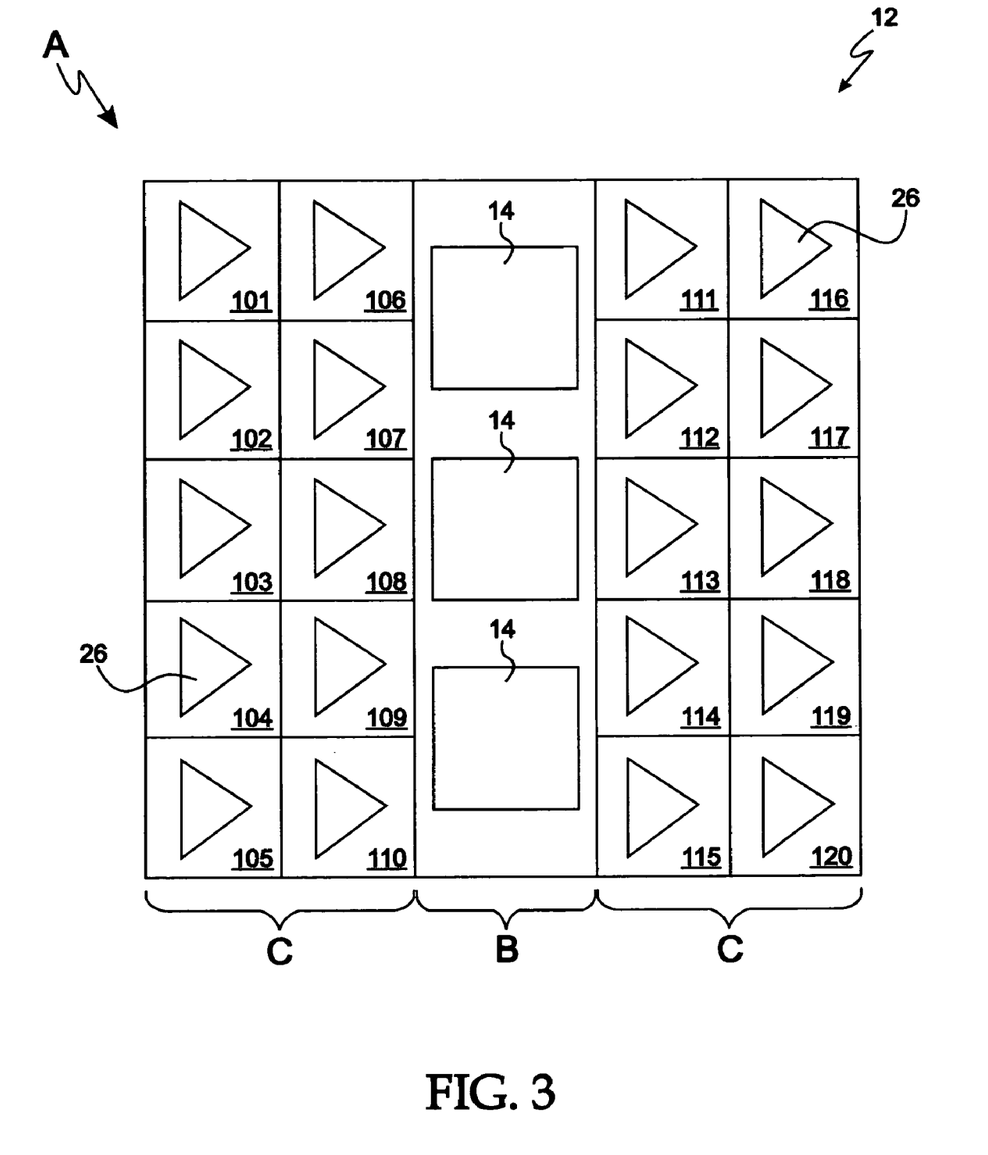
FIG. 3 illustrates high-intensity alpha particle emission regions and low-intensity alpha particle emission regions of an integrated circuit die.

FIG. 3 illustrates another example of how component placement regions of the exemplary flip-chip die 12 of FIG. 2 may be apportioned. Regions are divided according to susceptibility to different intensities of alpha particle radiation. The sizes of these regions may be calculated based on knowledge of the alpha particle energy, possible trajectories of the alpha particles, and the reduction in energy of the particles as they travel further from the source.

In the example of FIG. 3, region B containing solder bumps 14 is designated as a high-intensity alpha particle emission region. All other areas of the die, equal to region A of die 12 minus high-intensity alpha particle emission region B, are designated as low-intensity alpha particle emission region C. Region C may be considered as a single region or a number of adjoining regions. In the present application, a placement engine can place radiation insensitive cells anywhere in region A, including region B, while radiation-sensitive cells are placed in region C. Region B may be substantially similar to previously unused space in the prior art having a blocking region, which restricts the placement of any components in such space.

In the present example of FIG. 3, regions A, B and C are rectangular in shape. However, it should be noted that the shapes can be circular shapes concentric with the solder bump locations, or any other suitable shape for establishing a proper boundary between areas that might likely experience a high volume of alpha particle strikes and areas that might experience a relatively low volume of such strikes.

In an alternative embodiment, a different pattern of regions can be established in which more than two types of regions can designate more than two intensity levels. For example, in this alternative embodiment, the regions may be divided according to several levels of susceptibility to alpha particle strikes. Instead of only high intensity regions and low intensity regions, the regions may include any number and arrangement of intensity levels. The terms "high" and "low" in this context are relative terms and may be dependent upon various factors related to the size and composition of the solder bumps, energy absorption characteristics of the silicon material, sensitivity of various semiconductor components, and other factors as can be measured or predicted using statistical analysis as will be understood by one of ordinary skill in the art.

Continuing to refer to FIG. 3, there are shown sub-regions 101 through 120 in region C, where each such sub-region contains a local clock buffer 26. According to a further aspect of the present invention, and as described briefly above, storage components are preferentially placed within one of such sub-regions so as to reduce the physical or spatial distance between each such local clock buffer and its corresponding storage element(s), as well as to facilitate the use of industry standard placement engines (more about which we say below). This, in turn, reduces the amount of time required for electrical signals to travel between such components. In one preferred embodiment of the present invention, skew between such components is limited to a maximum of 30 picoseconds, although other maximum skews may be employed, such as about 100 picoseconds, about 90 picoseconds, about 80 picoseconds, about 70 picoseconds, about 60 picoseconds, about 50 picoseconds, about 40 picoseconds, about 30 picoseconds, about 20 picoseconds, about 10 picoseconds or about 5 picoseconds or less. In preferred embodiments of the present invention, however, skews between a storage component and a local clock buffer are limited to about 30 picoseconds, about 20 picoseconds, about 10 picoseconds or about 5 picoseconds or less.

Continuing to refer to FIG. 3, it will now become apparent that more efficient use of silicon area and smaller designs are permitted by the present invention. Silicon area is expensive and needs to be utilized to the fullest extent possible. The present invention allows the use of previously unused silicon area while permitting the use of smaller, non-Alpha hardened storage components. Instead, storage components are placed near corresponding local clocking buffers. While clock buffer placement is often not uniform owing to, for example, IP placement or because a designer restricts storage components to a particular area of a die, forcing storage cells or components to be placed close to a corresponding local clocking buffer facilitates timing closure.

At least some industry standard placement engines may be used to effect such a placement scheme, such as SYNOPSYS-PHYSOPT™ and CADENCE-GPS™ software package tools, where placement of a specific standard cell type in a specific region is permitted. As a result, the number of resources required to design flip-chip integrated circuits is reduced. The present invention may be employed in conjunction with some currently-available industry standard placement and route engines, saving designers time and encouraging wide-spread usage.

In one embodiment of the present invention, there is provided an algorithm that prevents the placement of storage components under solder bump regions while permitting the placement of such components near corresponding local clock buffers. Some currently-available industry standard placement engines do not allow "keep-out" regions to be employed on a per cell or per cell type basis. That is, some placement engines cannot exclude a specific instance or specific cell type from a given region while allowing other cells or cell types to be placed in such region. Instead, such placement tools are only capable of keeping specific cells within a specified rectilinear region.

To solve this problem, and according to one embodiment of the present invention illustrated in FIG. 3, a set of rectangles or sub-regions 101-120 is defined around local clock buffers 26 that are intended to be connected to a set of corresponding storage cells or components. (The specific storage cells that are to be connected to specific local clock buffers are not determined until after final placement of the storage cells.) The rectangle around each local clock buffer 26 is defined such that it overlaps a neighboring local clock buffer's rectangle, if the spacing between the clock buffers is nominal. When possible, rectangles 101-120 are combined into larger but fewer rectangles. Combining rectangles reduces the computation time needed for the placement engine. A given rectangle's dimensions are reduced when it has been determined to overlap with a restricted region. The placement engine generates a set of rectangles 101-120 that does not include regions under solder bumps 14 but whose boundaries are sufficiently close to a set of local clocking buffers 26. Once the new set of sub-regions 101-120 has been created, the placement of storage devices is then restricted to such new set of sub-regions 101-120, while non-storage cells are permitted to be placed anywhere on die 12 aside from directly in contact with solder bumps 14.

Figure 4:
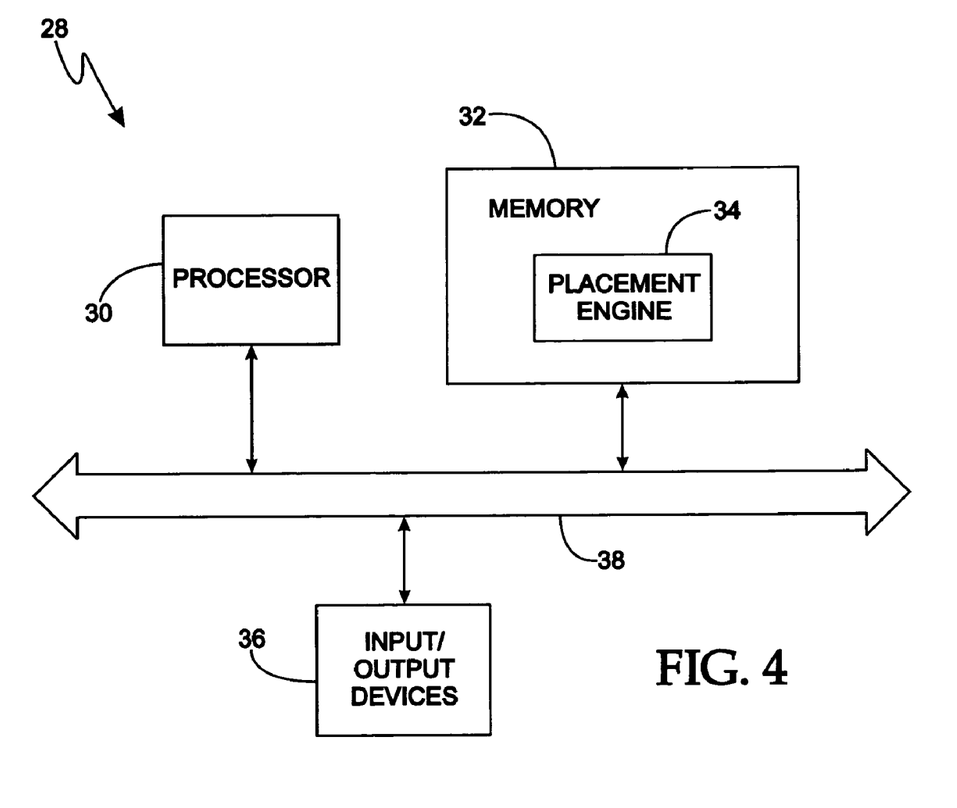
FIG. 4 is a block diagram of an embodiment of a computer system for determining the placement of standard cells on an integrated circuit die.

FIG. 4 is a block diagram of one embodiment of a computer system 28 for placing standard cells on an integrated circuit die during a design stage. Computer system 28 comprises processor 30, memory 32 having placement engine 34 stored therein, and input/output (I/O) devices 36. Processor 30, memory 32 and I/O devices 36 are in communication with each other via local interface 38, which may be a wired or wireless interface. Placement engine 34 stored in memory 32 may contain software, source code or the like, for determining the placement of "radiation-sensitive" components and their corresponding local clock buffers, and "radiation-insensitive" components on an integrated circuit die. The placement engine includes functions for distinguishing between the sensitive and insensitive components, placing sensitive components in certain regions on the die, placing insensitive components in any region, and placing certain sensitive components in close proximity to local clock buffers.

A user such as a circuit designer may interact with the computer system 28 using input/output device 36, which may comprise, for example, a keyboard, keypad, monitor, etc. The user may enter characteristics of the location and size of the solder bumps on flip-chip die 12. The user may also enter other parameters, such as the composition of the solder being used for the solder bumps, the sensitivity of standard cells to alpha particle radiation, or other information useful for determining acceptable regions on the die for the radiation-sensitive components and corresponding local clock buffers 26.

Placement engine 34 may be configured to perform certain functions in order to properly position the standard cells on die 12 based on the cell's sensitivity to alpha particles and its physical or spatial proximity to a corresponding local clock buffer 26. For example, placement engine 34 may determine where solder bumps 14 have been placed or extract such information from data entered by the user. Placement engine 34 may also compute the coordinates of a first set of regions, such as region B in FIGS. 2 and 3 surrounding solder bumps 14, and a second set of regions C that include all other available space.

In addition, placement engine 34 may analyze components to distinguish between sensitive and insensitive components. Placement engine 34 then places the components on die 12 based on alpha particle sensitivity.

The placement of memory cells or other storage components sensitive to alpha particle radiation is restricted to the second set of regions C, and more particularly to a predefined distance, physical proximity or spatial position from or in respect of a corresponding local clock buffer 26, when such component is to be operably connected to a given local clock buffer 26. Placement in proximity to an alpha particle source may induce a greater number of soft errors and short storage cell, and therefore distance, spatial position and/or physical proximity between a selected local clock buffer and a storage component must be such that the maximum skew between such components is about 100 picoseconds or less, about 90 picoseconds or less, about 80 picoseconds or less, about 70 picoseconds or less, about 60 picoseconds or less, about 50 picoseconds or less, about 40 picoseconds or less, about 30 picoseconds or less, about 20 picoseconds or less, about 10 picoseconds or less, or about 5 picoseconds or less. In preferred embodiments of the present invention, such maximum skew is about 30 picoseconds or less, about 20 picoseconds or less, about 10 picoseconds or less, or about 5 picoseconds or less.

Insensitive components may be placed anywhere in region A, even within region B. Insensitive components, such as non-storage type cells, are not restricted from the B regions, where alpha particle emission is more intense, since such components are not adversely affected by alpha particle radiation.

Placement engine 34 may be a stand-alone program or may be an add-on routine or sub-routine to supplement other component placement software, which can also be stored in memory 32. Placement engine 34 preferably conforms with industry standard placement and routing engines, thereby saving time for the users of placement engine 34, i.e. circuit designers.

Placement engine 34 may be implemented in hardware, software, firmware or a combination thereof. In the disclosed embodiments, placement engine 34 is implemented in software or firmware that is stored in a memory, e.g. memory 32, and that is executed by a suitable instruction execution system, e.g. processor 30. If implemented in hardware, as in an alternative embodiment, placement engine 34 may be implemented with any combination of discrete logic circuit elements for implementing logic functions.

Placement engine 34 may comprise a placement algorithm or computer program, which comprises an ordered listing of executable instructions for implementing logical functions. The algorithm or program can be embodied in any "computer-readable medium" for use by an instruction execution system or device, such as a computer-based or processor-based system. In the context of this document, a computer-readable medium may be any medium that can contain, store, communicate, propagate, or transport the placement program for execution by the processor 30 or other suitable instruction execution system or device and can be stored in an electronic, magnetic, optical, or other suitable format. The computer-readable medium may include a computer diskette, random access memory (RAM) element, read-only memory (ROM) element, programmable read-only memory (PROM) element, flash memory, compact disc read-only memory (CDROM), or other suitable memory element.

Figure 5:
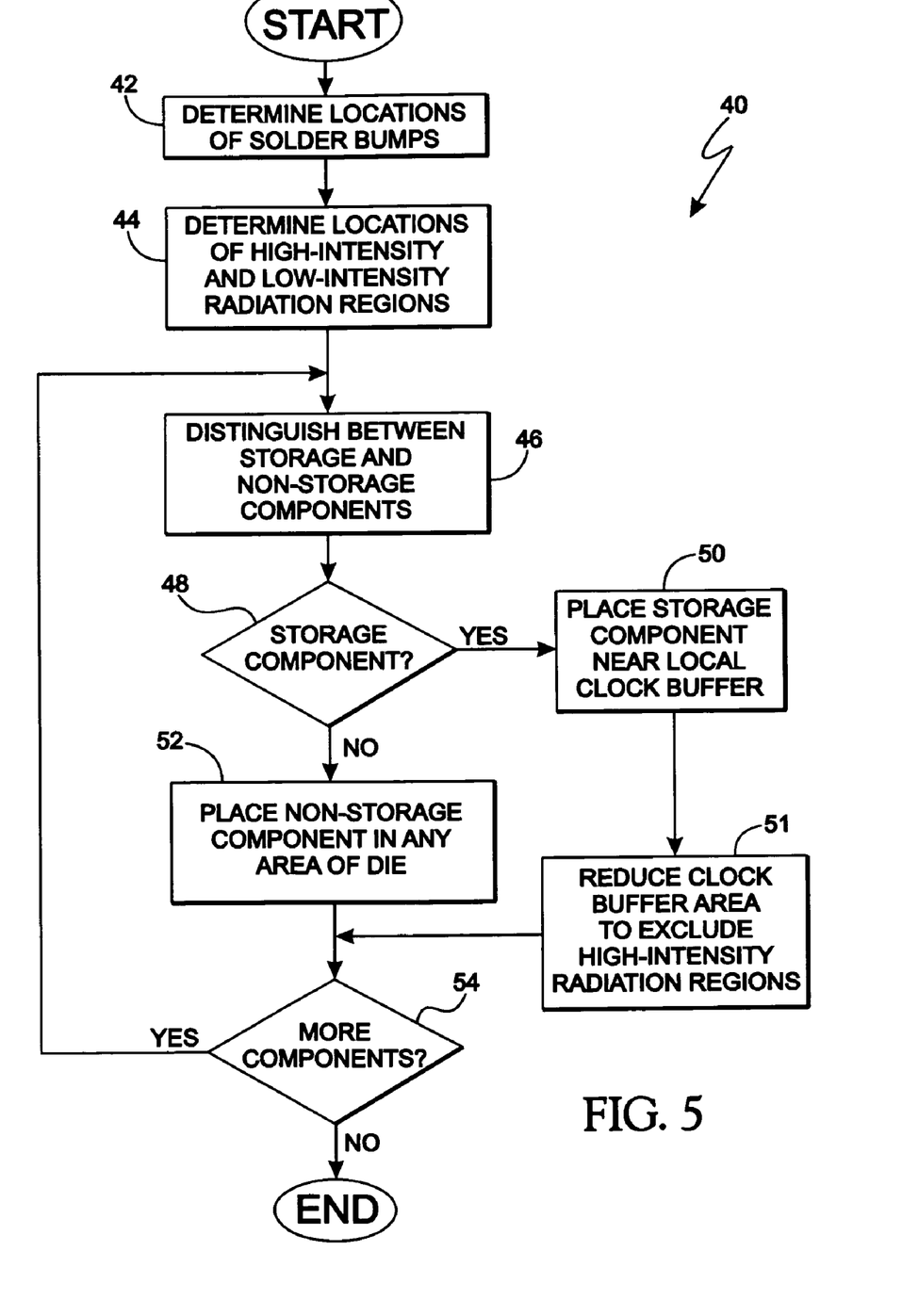
FIG. 5 is a flow chart of an embodiment of a process for determining the placement of standard cells on an integrated circuit die.

FIG. 5 is a flow chart of one embodiment of a method or placement algorithm 40 of the present invention, or placement sub-routine thereof, for placing semiconductor components on an integrated circuit die. In one embodiment of the present invention, placement algorithm 40 corresponds to the functionality described with respect to placement engine 34 shown in FIG. 4. Placement algorithm 40 may be used during a design stage for placing standard cells, representing semiconductor components, on an integrated circuit die.

Placement algorithm 40 includes a first block 42 for determining the locations of solder bumps 14 on flip-chip die 12 on which standard cells are to be placed. Block 42 may comprise receiving data from a circuit designer, program or database regarding the locations of solder bumps 14.

Block 44 includes determining the locations of regions on silicon die 12 that are high-intensity alpha particle emission regions and the locations of regions that are low-intensity radiation regions. Determining the locations of such regions may further comprise computing coordinates for defining the boundaries of those regions. Alternatively, block 44 may further comprise determining one or more additional regions characterized by high, medium, low or other alpha particle intensities. In this alternative aspect of block 44, placement algorithm 40 may be configured to determine any number of intensity level regions. Finally, block 44 further comprises determining the respective locations on die 12 of local clock buffers 26 and their corresponding storage components such that skew therebetween is limited to about 30 picoseconds.

Block 46 comprises analyzing a component, such as a standard cell, to determine whether the component is a storage component or a non-storage component, and whether the component is radiation-sensitive or radiation non-sensitive. This block may also classify the component as a memory element, which is typically alpha sensitive, or a non-memory element, which is typically not alpha-sensitive. Alternatively, block 46 may further comprise analyzing one of multiple different intensity ranges that standard cells may be able to handle without experiencing errors, corresponding to the alternative embodiments of multiple regions defined with respect to block 44, if available.

Decision block 48 determines whether or not the component analyzed in block 46 is a storage component, i.e. sensitive to alpha particle radiation and preferably placed close to a local clock buffer. If so, the flow proceeds to block 50, where the component is placed in a low-intensity alpha particle emission region and near a selected local clock buffer as defined with respect to block 44. This region includes any area that is not subject to intense alpha particle emission, e.g. region C. In block 51 it is determined whether the area surrounding the selected local clock buffer includes any high-intensity radiation regions. If so, such high-intensity radiation regions are excluded or cut out from the design area surrounding the selected local clock buffer.

If it is determined in decision block 48 that the component is not a sensitive component, then flow proceeds to block 52, where the radiation insensitive component is placed in any area of the die, e.g. region A. From block 50 and 52, flow proceeds to block 54. In decision block 54, it is determined whether or not any more components may be added to die 12. If so, the flow loops back to block 46 to handle the placement of the next component. If no more components are to be placed, then placement algorithm 40 ends.

It should be noted that if more than two regions are established in block 44 for multiple alpha particle intensity levels, then blocks 46, 48, 50, and 52 may be altered accordingly to accommodate the placement of components into respective regions according to the component's sensitivity to alpha particles.

The flow chart of FIG. 5 shows the architecture, functionality, and operation of possible implementations of placement engine software. In this regard, each block represents a module, segment, or portion of code, which comprises one or more executable instructions for implementing the specified logical function(s). It should also be noted that in some alternative implementations, the functions noted in the blocks may be executed out of the order noted in FIG. 5, may be executed substantially concurrently, or may be executed in a reverse order, if possible, depending upon the functionality involved, as would be understood by those having a reasonable degree of skill in the art.

As a result, the present disclosure provides an efficient component placement strategy that better utilizes silicon areas, including space that was previously unused in the prior art. The present disclosure also teaches the utilization of smaller design components that take up less space on the silicon real estate instead of larger alpha-hardened components. In this manner, the present disclosure is able to keep material costs low without compromising the integrity of the die. And by placing radiation-sensitive components offset from the locations of the solder bumps, the likelihood of soft errors in the components can be minimized.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

Having read and understood the present disclosure, those skilled in the art will now understand that many combinations, adaptations, variations and permutations of known semiconductor die designs, systems, devices, components and methods may be employed successfully in the present invention.

In the claims, means plus function clauses are intended to cover the structures described herein as performing the recited function and their equivalents. Means plus function clauses in the claims are not intended to be limited to structural equivalents only, but are also intended to include structures which function equivalently in the environment of the claimed combination.

All printed publications and patents referenced hereinabove are hereby incorporated by referenced herein, each in its respective entirety.

We claim:

1. A semiconductor die, comprising:
(a) a first region comprising at least one solder bump and at least one non-storage element, the first region having high alpha particle radiation;
(b) a second region comprising at least one local clock buffer operably connected to and spatially positioned in respect of at least one storage element such that the maximum skew therebetween does not exceed about 100 picoseconds, the second region having low alpha particle radiation;
wherein the first region contains no storage elements.

2. The semiconductor die of claim 1, wherein the maximum skew is at least one of about 100 picoseconds or less, about 90 picoseconds or less, about 80 picoseconds or less, about 70 picoseconds or less, about 60 picoseconds or less, about 50 picoseconds or less, about 40 picoseconds or less, about 30 picoseconds or less, about 20 picoseconds or less, about 10 picoseconds or less, and about 5 picoseconds or less.

3. The semiconductor die of claim 1, wherein the maximum skew is at least one of about 30 picoseconds or less, about 20 picoseconds or less, about 10 picoseconds or less, and about 5 picoseconds or less.

4. The semiconductor die of claim 1, wherein the at least one storage element is at least one of a latch, a memory cell, a memory, a RAM, a DRAM, an SRAM, a CAM, a register, a register and flop, a register array, a register file, a register array, a synchronous register, a register with reset, a register with clear, a register with pre-set, an asynchronous register, a scannable register and a non-scannable register.

5. The semiconductor die of claim 1, wherein the first region is characterized in generating high alpha particle radiation.

6. The semiconductor die of claim 1, wherein the first region includes areas in proximity to sources of alpha particle radiation.

7. The semiconductor die of claim 1, wherein the solder bumps generate alpha particle radiation.

8. The semiconductor die of claim 1, wherein the solder bumps comprise a metal or metal alloy that emits alpha particles.

9. The semiconductor die of claim 8, wherein the solder bumps comprise at least one of Lead (Pb), a $U^{235}$ isotope, a $U^{238}$ isotope and a $Th^{232}$ isotope.

10. The semiconductor die of claim 1, further comprising a third region of intermediate alpha radiation, the third region being located between the first and second regions.

11. A method of designing a semiconductor die, comprising defining first and second regions in the die, placing in the first region at least one solder bump and at least one non-storage element, placing in the second region at least one local clock buffer operably connected to and spatially positioned in respect of at least one storage element such that the maximum skew therebetween does not exceed about 100 picoseconds, and placing no storage elements in the first region.

12. The method of claim 11, wherein the maximum skew is at least one of about 100 picoseconds or less, about 90 picoseconds or less, about 80 picoseconds or less, about 70 picoseconds or less, about 60 picoseconds or less, about 50 picoseconds or less, about 40 picoseconds or less, about 30 picoseconds or less, about 20 picoseconds or less, about 10 picoseconds or less, and about 5 picoseconds or less.

13. The method of claim 11, wherein the maximum skew is at least one of about 30 picoseconds or less, about 20 picoseconds or less, about 10 picoseconds or less, and about 5 picoseconds or less.

14. The method of claim 11, further comprising placing a plurality of standard cells in the first and second regions of the semiconductor die, each standard cell being placed on the basis of its corresponding sensitivity to radiation.

15. The method of claim 11, wherein the first region is exposed to a high intensity of radiation and the second region is exposed to a low intensity of radiation.

16. The method of claim 11, wherein the first region includes areas in proximity to sources of radiation.

17. The method of claim 16, wherein the sources of radiation are the solder bumps.

18. The method of claim 11, wherein the solder bumps comprise a metal or metal alloy that emits alpha particles.

19. The method of claim 18, wherein the solder bumps comprise at least one of Lead (Pb), a $U^{235}$ isotope, a $U^{238}$ isotope and a $Th^{232}$ isotope.

20. The method of claim 11, further comprising defining a third region on the die, the third region being located between the first and second regions, each of the first, second and third regions representing different intensity levels of alpha particle radiation.

21. A method of making a semiconductor die, comprising providing first and second regions for the die, fabricating in the first region at least one solder bump and at least one non-storage element, fabricating in the second region at least one local clock buffer operably connected to and spatially positioned in respect of at least one storage element such that the maximum skew therebetween does not exceed about 100 picoseconds, and fabricating no storage elements in the first region.

22. The method of claim 21, wherein the maximum skew is at least one of about 100 picoseconds or less, about 90 picoseconds or less, about 80 picoseconds or less, about 70 picoseconds or less, about 60 picoseconds or less, about 50 picoseconds or less, about 40 picoseconds or less, about 30 picoseconds or less, about 20 picoseconds or less, about 10 picoseconds or less, and about 5 picoseconds or less.

23. The method of claim 21, wherein the maximum skew is at least one of about 30 picoseconds or less, about 20 picoseconds or less, about 10 picoseconds or less, and about 5 picoseconds or less.

24. The method of claim 21, further comprising forming a plurality of standard cells in the first and second regions of the semiconductor die, each standard cell being placed and formed on the basis of its corresponding sensitivity to radiation.

25. The method of claim 21, wherein the first region is exposed to a high intensity of radiation and the second region is exposed to a low intensity of radiation.

26. The method of claim 21, wherein the first region includes areas in proximity to sources of radiation.

27. The method of claim 26, wherein the sources of radiation are the solder bumps.

28. The method of claim 21, wherein the solder bumps comprise a metal or metal alloy that emits alpha particles.

29. The method of claim 28, wherein the solder bumps comprise at least one of Lead (Pb), a $U^{235}$ isotope, a $U^{238}$ isotope and a $Th^{232}$ isotope.

30. A computer system, comprising:
memory for storing a placement engine, and
a processor in communication with the memory, the processor configured to execute the placement engine stored in the memory;
wherein the placement engine comprises:
logic configured to determine the location of solder bumps on an integrated circuit die;
logic configured to determine a first set of regions including the areas on the integrated circuit die in proximity to the solder bumps;
logic configured to determine a second set of regions including the areas on the integrated circuit die outside the first set of regions;
logic configured to identify whether a standard cell is a storage element or a non-storage element;
logic configured to place the standard cell in one of the second set of regions and in proximity to a local clock buffer such that the maximum skew therebetween is about 100 picoseconds or less if the standard cell is identified to be a storage element; and
logic configured to place the standard cell anywhere on the integrated circuit die if the standard cell is identified to be a non-storage component.

31. The method of claim 30, wherein the maximum skew is at least one of about 100 picoseconds or less, about 90 picoseconds or less, about 80 picoseconds or less, about 70 picoseconds or less, about 60 picoseconds or less, about 50 picoseconds or less, about 40 picoseconds or less, about 30 picoseconds or less, about 20 picoseconds or less, about 10 picoseconds or less, and about 5 picoseconds or less.

32. The method of claim 30, wherein the maximum skew is at least one of about 30 picoseconds or less, about 20 picoseconds or less, about 10 picoseconds or less, and about 5 picoseconds or less.

33. The computer system of claim 30, wherein the integrated circuit die is a flip-chip die.

34. The computer system of claim 30, wherein the first set of regions are more susceptible to alpha particle radiation than the second set of regions.

35. The computer system of claim 30, wherein the logic configured to determine the first set of regions and the logic configured to determine the second set of regions determine the regions such that storage elements placed in the second region experience fewer soft errors.

* * * * *